United States Patent
Zou et al.

(10) Patent No.: US 10,209,135 B2
(45) Date of Patent: Feb. 19, 2019

(54) METHOD FOR MEASURING MULTI-CHANNEL MISMATCH OF ULTRA-HIGH SPEED PHOTONIC SAMPLER AND MEASUREMENT COMPENSATION DEVICE THEREOF

(71) Applicant: Shanghai Jiao Tong University, Shanghai (CN)

(72) Inventors: Weiwen Zou, Shanghai (CN); Guang Yang, Shanghai (CN); Huajie Zhang, Shanghai (CN); Jianping Chen, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 128 days.

(21) Appl. No.: 15/544,188

(22) PCT Filed: Oct. 30, 2014

(86) PCT No.: PCT/CN2014/089903
§ 371 (c)(1),
(2) Date: Jul. 17, 2017

(87) PCT Pub. No.: WO2016/061838
PCT Pub. Date: Apr. 28, 2016

(65) Prior Publication Data
US 2018/0024009 A1    Jan. 25, 2018

(30) Foreign Application Priority Data
Oct. 22, 2014    (CN) .......................... 2014 1 0567490

(51) Int. Cl.
*G01J 11/00*    (2006.01)
*G01J 3/28*    (2006.01)
(Continued)

(52) U.S. Cl.
CPC ................ *G01J 11/00* (2013.01); *G01J 1/58* (2013.01); *G01J 3/28* (2013.01); *G01R 27/28* (2013.01)

(58) Field of Classification Search
CPC ........................................................ G01J 11/00
(Continued)

(56) References Cited

U.S. PATENT DOCUMENTS 5,909,659  A      6/1999  Fujita
9,250,128  B2 *   2/2016  Zheng ....................... G01J 3/42
(Continued)

FOREIGN PATENT DOCUMENTS

| CN | 101701852 A | 5/2010 |
| CN | 101718562 A | 6/2010 |
| CN | 103809346 A | 5/2014 |

OTHER PUBLICATIONS

Clark, T. R., et al., "Performance of a time-wavelength interleaved photonic sampler for analog-digital conversion" J. Photonics Technology Letters, IEEE, 1999, 11(9): 1168-1170.

*Primary Examiner* — Hien D Khuu
(74) *Attorney, Agent, or Firm* — Mei & Mark LLP; Manni Li

(57) ABSTRACT

The present invention relates to a measuring and compensating method for channel mismatch of an ultra-high speed time-wavelength interleaved optical pulse sequence, by employing a generating module of the to-be tested ultra-high speed time-wavelength interleaved optical pulse sequence, an optical spectrum measuring module, an electrical frequency measuring module, and a data analyzing and processing module. The present invention obtains mismatch information of the pulse sequence for each channel by means of measurement and analysis of the ultra-high speed time-wavelength interleaved optical pulse sequence, thus overcoming the bottleneck of inadequate sampling of time-
(Continued)

domain observation via an oscilloscope. The channel mismatch information obtained by the present invention may act as a basis for channel mismatch compensation and correction for the ultra-high speed time-wavelength interleaved optical pulse sequence.

2 Claims, 3 Drawing Sheets

(51) Int. Cl.
     *G01R 27/28*     (2006.01)
     *G01J 1/58*     (2006.01)

(58) Field of Classification Search
     USPC .......................................................... 702/69
     See application file for complete search history.

(56) References Cited

U.S. PATENT DOCUMENTS

| | | | |
|---|---|---|---|
| 2005/0225840 A1* | 10/2005 | Drasek | G01N 21/39 359/333 |
| 2006/0088259 A1* | 4/2006 | Weiner | G01J 11/00 385/122 |
| 2008/0088852 A1* | 4/2008 | Rogers | A61B 3/102 356/497 |
| 2010/0288928 A1 | 11/2010 | Katagiri et al. | |
| 2014/0378328 A1* | 12/2014 | Chakravarty | B01J 19/0046 506/9 |

* cited by examiner

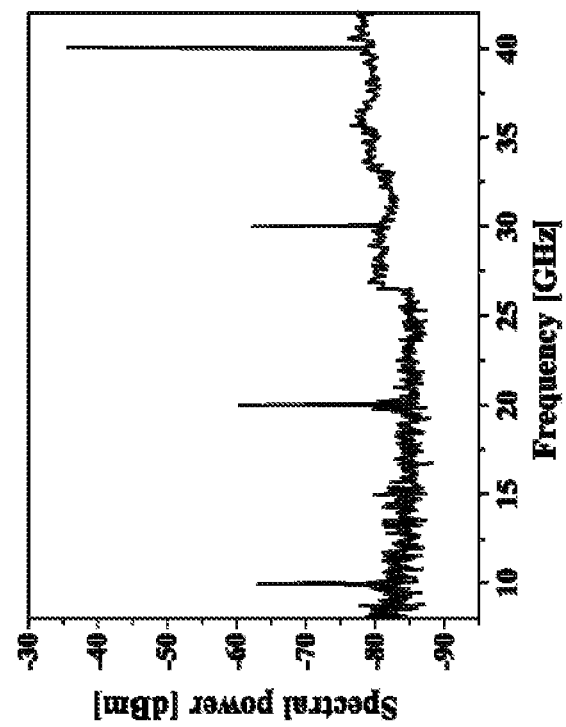
Figure 2(a)
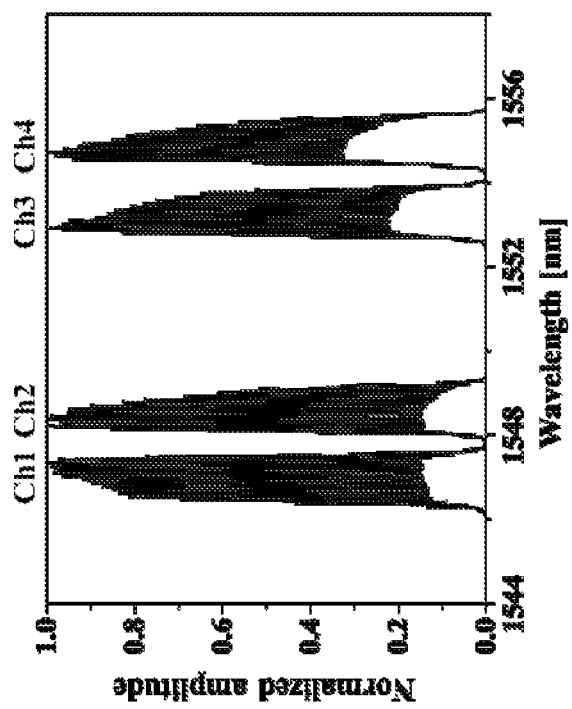
Figure 2(b)
Figure 2

METHOD FOR MEASURING MULTI-CHANNEL MISMATCH OF ULTRA-HIGH SPEED PHOTONIC SAMPLER AND MEASUREMENT COMPENSATION DEVICE THEREOF

CROSS-REFERENCE TO RELATED APPLICATIONS

The subject application is a U.S. national stage of PCT/CN2014/089903 filed on Oct. 30, 2014 and claims priority on Chinese application no. 201410567490.3 filed on Oct. 22, 2014. The contents and subject matter of the PCT and Chinese priority applications are incorporated herein by reference.

FIELD OF INVENTION

The present invention relates to photonic information processing, particularly, a method for measuring and compensating for channel mismatch of an ultra-high speed photonic sampler.

BACKGROUND ART

Photonic analog to digital conversion (PADC) techniques have been progressing rapidly in recent years, and have become hotspots in photonic electronics. Since PADC performance depends on properties of the photonic sampler thereof, how to generate a high-speed and stable optical pulse sequence for the photonic sampler has become an important subject in the field of the art. Time-wavelength interleaved technique (Clark T R, Kang J U, Esman R D, Performance of a time-wavelength interleaved photonic sampler for analog-digital conversion [J]. Photonics Technology Letters, IEEE, 1999, 11(9): 1168-1170.), as an effective method for generating an ultra-high repetition rate optical pulse sequence, makes full use of low jitter property of a mode-locked laser and advantages of the high repetition rate and wide band thereof to generate a stable ultra-high speed optical pulse sequence, thus becoming a general method for generating an ultra-high speed photonic sampling clock.

However, for an ultra-high speed photonic sampling clock generated by time-wavelength interleaving, there exist some extent mismatches among different channels in respect of time delay, amplitude and pulse shapes. In actual scenario, variable optical delay lines and a variable attenuator are introduced in each channel for adjustment of mismatch of time delay and amplitude (Zou, Weiwen; Li, Xing, et al., An ultra-high speed photonic digital to analog conversion method and device therefor, China Patent No. 201410065510.7 [P], 2014). For compensation of channel mismatch, real time measurement of the pulse sequence in each channel is needed by means of experiment, and the variable optical delay lines and variable attenuators are adjusted in accordance with the measured amplitude and delay information for realization of matching among the channels. For comparative low repetition rate optical pulse sequences, amplitude and time delay information may be obtained simply by means of time-domain observation via an oscilloscope. However, for ultra-high speed optical pulse sequences, time-domain measurement thereof cannot be implemented due to limitation of sampling rate of the oscilloscope. Therefore, other methods are needed to be sought out for measurement of channel mismatch of an ultra-high speed time-wavelength interleaved optical pulse sequence.

SUMMARY OF THE INVENTION

The object of the present invention is to overcome the defect of the current technology by providing a method for measuring multi-channel mismatch of an ultra-high speed photonic sampler and a measurement compensation device thereof, which is realized by measuring the spectrum and frequency of the pulse sequence respectively via an optical spectrum analyzer and an electrical spectrum analyzer and by analyzing the frequency domain information to obtain the mismatches of the various channels, thus being employed for effective compensation method for mismatches.

The technical principle of the present invention is as follows:

For a time-wavelength interleaved pulse sequence having M channels and a period of $T_s$, the time-domain of the pulse sequence may be expressed as:

$$I_k(t) = a_k u_k(t - \tau_k) * \sum_{m=-\infty}^{+\infty} \delta[t - mMT_s - (k-1)T_s] \quad (1)$$

$$k = 1, 2, \ldots, M$$

wherein $a_k$ is the pulse amplitude of the kth channel, $\tau_k$ the time delay thereof, and $u_k(t)$ the normalized waveform thereof. The signal obtained by a photodetector with a responsivity of $R_{PD}$ is:

$$s(t) = R_{PD} \sum_{k=1}^{M} I_k(t) \quad (2)$$

The radio frequency power spectrum as measured by an electrical spectrum analyzer is expressed as:

$$|\tilde{s}(f)|^2 = \left| \frac{R_{PD}}{MT_s} \sum_{k=1}^{M} a_k \tilde{u}_k(f) e^{-j2\pi f \tau_k} e^{-j2\pi(k-1)f/f_s} \right|^2 \sum_{m=-\infty}^{+\infty} \delta(f - mf_s/M) \quad (3)$$

wherein $f_s = 1/T_s$, and $\tilde{u}_k(f)$ is the Fourier transformation of $u_k(t)$. The latter may be obtained by means of calculation of the measured optical spectrum:

$$\tilde{u}_k(f) = \frac{|E_k(f)|^2}{\max\{|E_k(f)|^2\}} \quad k = 1, 2, \ldots, M \quad (4)$$

$E_k(f)$ represents the optical spectrum as measured by the optical spectrum analyzer in the kth channel. In the same manner, the amplitude $a_k$ in each channel may be obtained by means of calculation of the optical spectrum power:

$$a_k = |\int_{-\infty}^{+\infty} E_k(f) df|^2 \quad k = 1, 2, \ldots, M \quad (5)$$

According to expression (3), there exist M peaks $P_k$, k=1, 2, ..., M, on the interval $[0, f_s]$ of the radio frequency spectrum, with an expression:

$$P_k = \left(\frac{R_{PD}}{MT_s}\right)^2 \left|\sum_{l=1}^{M} a_l \tilde{u}_l(kf_s/M) e^{-j2\pi(kf_s/M)\tau_l} e^{-j2\pi k(l-1)/M}\right|^2 \qquad (6)$$

$$k = 1, 2, \ldots, M$$

Expression (6) implicates that $P_k$ is a of $a_k$, $\tilde{u}_k(f)$ and $\tau_k$, $k=1, 2, \ldots, M$, with an expression:

$$P_k = P_k[a_1, a_2, \ldots, a_M; \tilde{u}_1(f), \tilde{u}_2(f), \ldots, \tilde{u}_M(f); \tau_1, \tau_2, \ldots, \tau_M] \qquad (7)$$

The M spectrum peaks $C_k$, $k=1, 2, \ldots, M$ measured by the electrical spectrum analyzer corresponds with $P_k$ with a relation:

$$10 \log_{10} P_k = C_k k = 1, 2, \ldots, M \qquad (8)$$

For time delay and without loss of generality, $\tau_1 = 0$ may be supposed to be the reference starting point. By rearranging expression (8), M independent equations may be obtained:—

$$\begin{cases} 10 \log_{10} \dfrac{P_M}{P_k} = C_M - C_k, k = 1, 2, \ldots, M - 1 \\ \tau_1 = 0 \end{cases} \qquad (9)$$

Since $\tilde{u}_k(f)$ and $a_k$ may be obtained by calculating the expressions (4) and (5), with the calculated results therefrom, and in accordance with the function relation of expression (7), $P_k$ becomes a function of just one argument of the time delay $\tau_k$, and expression (9) becomes an equation group solely in respect of the time delay $\tau_k$:

$$\begin{cases} 10 \log_{10} \dfrac{P_M(\tau_1, \tau_2, \ldots, \tau_M)}{P_k(\tau_1, \tau_2, \ldots, \tau_M)} = C_M - C_k, k = 1, 2, \ldots, M - 1 \\ \tau_1 = 0 \end{cases} \qquad (10)$$

By means of solving expression (10) via numerical method, all the M time delays $\tau_k$, $k=1, 2, \ldots, M$ can be obtained.

In conclusion, the pulse amplitude and time delay in each channel may be obtained by means of measuring the pulse sequence optical spectrum and the radio frequency, and therewith as a basis to adjust the variable optical delay lines and the variable attenuator, compensation of channel mismatch is realized.

The technical solution of the present invention is as follows:

A method for measuring multi-channel mismatch of an ultra-high speed photonic sampler, comprising the following steps:

Step 1. Splitting a to-be tested multi-channel optical pulse signal sequence into 2 paths by means of an optical fiber coupler, with one path thereof being input into a spectrometer, the other path passing through a photodetector and being inputted into an electrical spectrum analyzer, with a measurement result of an input signal respectively of the spectrometer and of the electrical spectrum analyzer being outputted to a data analyzing and processing module;

Step 2. Calculating an amplitude $a_k$, $k=1, 2, \ldots, M$, of each channel, wherein M being a number of all the channels, with a formula as follows:

$$a_k = |\int_{-\infty}^{+\infty} E_k(f) df|^2 \qquad (11)$$

wherein $E_k(f)$ is an optical spectrum as measured by the spectrometer for the kth channel;

Calculating $\tilde{u}_k(f)$, wherein $u_k(t)$ being a Fourier transformation, $u_k(t)$ being a normalized waveform of the kth channel, with a formula as follows:

$$\tilde{u}_k(f) = \frac{|E_k(f)|^2}{\max\{|E_k(f)|^2\}} \qquad (12)$$

Step 3. Calculating a time delay $\tau_k$ with a formula as follows:

$$\begin{cases} 10 \log_{10} \dfrac{P_M(\tau_1, \tau_2, \ldots, \tau_M)}{P_k(\tau_1, \tau_2, \ldots, \tau_M)} = C_M - C_k, k = 1, 2, \ldots, M - 1 \\ \tau_1 = 0 \end{cases} \qquad (13)$$

wherein $C_k$, $k=1, 2, \ldots, M$ are M spectrum peaks measured by the electrical spectrum analyzer, $P_k$ are M peaks of a radio frequency spectrum on an interval $[0, f_s]$:

$$P_k = \left(\frac{R_{PD}}{MT_s}\right)^2 \left|\sum_{l=1}^{M} a_l \tilde{u}_l(kf_s/M) e^{-j2\pi(kf_s/M)\tau_l} e^{-j2\pi k(l-1)/M}\right|^2 \qquad (14)$$

$$k = 1, 2, \ldots, M$$

wherein M is a number of the total channels, $T_s$ is a sampling period, $f_s = 1/T_s$, and $R_{PD}$ is a responsivity of the photodetector.

A measurement compensation device for multi-channel mismatch of the ultra-high speed photonic sampler, comprising the 1×2 optical fiber coupler, the spectrometer, the photodetector, the electrical spectrum analyzer, the data analyzing and processing module, and a driving and feedback module.

An input port of the 1×2 optical fiber coupler is connected with an output port of a generating module of the to-be tested ultra-high speed time-wavelength interleaved optical pulse sequence and having variable optical delay lines and variable attenuators; the 1×2 optical fiber coupler splits the to-be tested ultra-high speed time-wavelength interleaved optical pulse sequence into 2 paths, with one path being connected with an input port of the spectrometer, the other path being successively connected with the photodetector and the electrical spectrum analyzer; an output port of the spectrometer and the electrical spectrum analyzer respectively is connected with an input port of the data analyzing and processing module; an output port of the data analyzing and processing module is connected with an input port of the driving and feedback module; an output port of the driving and feedback module is connected with the variable optical delay lines and the variable attenuators.

The generating module of the to-be tested ultra-high speed time-wavelength interleaved optical pulse sequence may adopt an active mode-locked fiber laser or a passive mode-locked fiber laser as laser source. Subsequently, wavelength division and de-multiplexing technique is adopted for multi-channel and multi-wavelength splitting, and time and amplitude adjustment is realized based on time delay and optical amplitude.

The spectrometer is employed for measuring the optical spectrum of the to-be tested ultra-high speed time-wavelength interleaved optical pulse sequence for the various channels.

The photodetector is employed for converting of the ultra-high speed time-wavelength interleaved optical pulse sequence to a radio frequency signal, the radio frequency power spectrum thereof being measured by means of the electrical spectrum analyzer.

The data analyzing and processing module is employed for analyzing and processing of the measured data by the spectrometer and the electrical spectrum analyzer, and comprises but is not limited to an analog signal processing circuit, digital, a digital signal processor, and computer software.

The driving and feedback module is employed for adjustment of the optical signal amplitude and time delay in accordance with the mismatch information, and comprises but is not limited to a mechanical structure and an electronic circuit.

In comparison with the prior art, the present invention is advantageous in that:

1. By means of frequency-domain measurement and numerical analysis of the ultra-high speed time-wavelength interleaved optical pulse sequence, bottleneck of sampling inadequacy is overcome in the time-domain measurement, and channel mismatch information is obtained from measurement results of the frequency-domain measurement.

2. The present invention is simple and easy to manipulate, as the mismatch information obtained may act as a basis for compensation and correction of channel mismatch, and the result thereof is more accurate than that of the time-domain direct observation.

BRIEF DESCRIPTION OF THE DRAWINGS

FIG. 2 shows spectra measured in the embodiment of the present invention, among which, FIG. 2(a) is a spectrum measured by the spectrometer, and FIG. 2(b) is a radio frequency spectrum measured by the electrical spectrum analyzer.

FIG. 3 shows radio frequency spectra obtained in the embodiment of the present invention, among which, FIG. 3(a) is a radio frequency spectrum calculated on the basis of analysis and processing of the mismatch information, and FIG. 3(b) is the radio frequency spectrum measured subsequent to compensation of channel mismatch.

DETAILED DESCRIPTION AND EMBODIMENTS

In combination with the figures provided hereunder, the present invention provides an embodiment hereunder, which is implemented based on the technical solution of the present invention and is provided with detailed means and procedure, but which is not meant to limit the scope of protection of the present invention.

Figure 1:
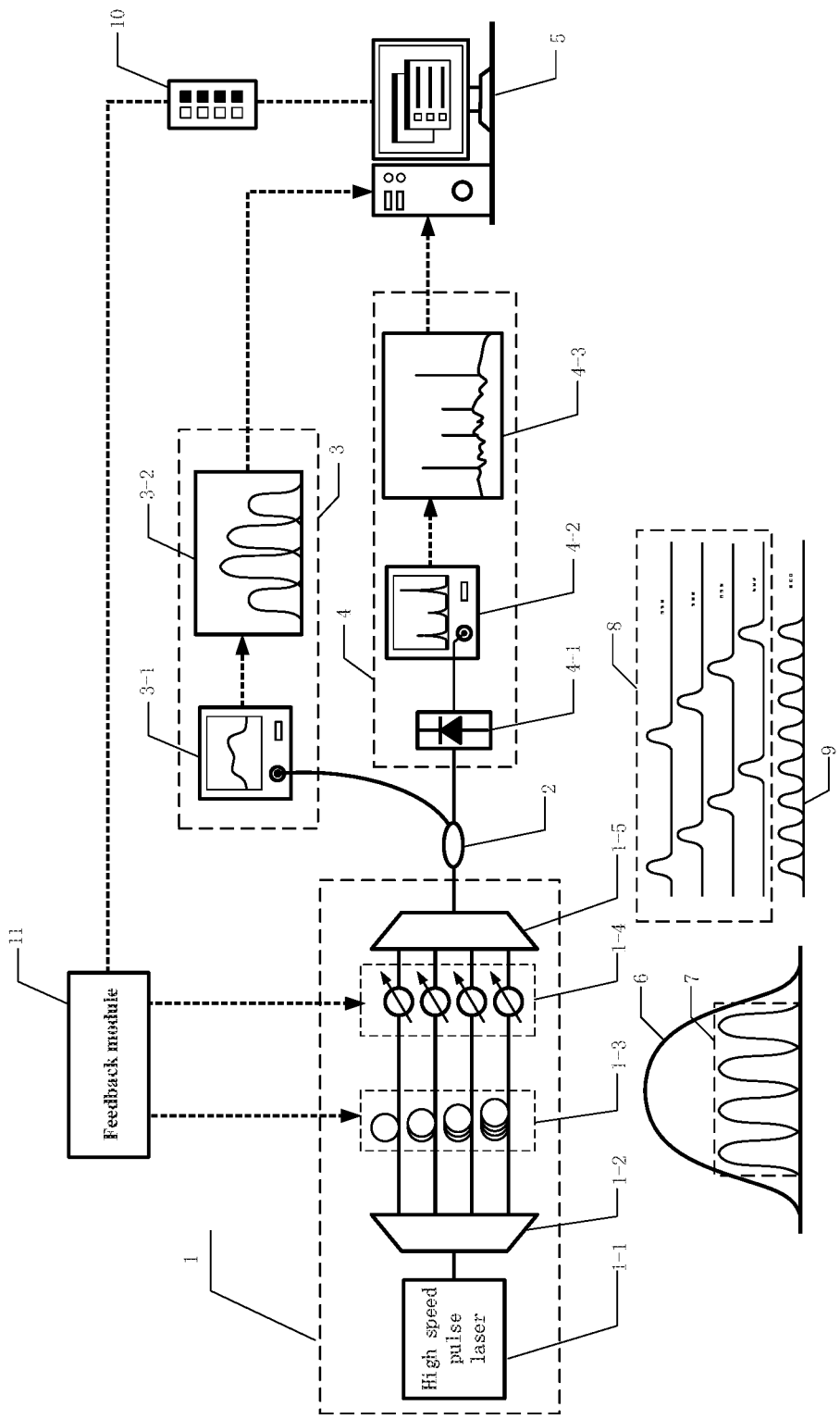
FIG. 1 is a schematic diagram of an embodiment of the present invention.

An embodiment of the present invention is shown in FIG. 1. As is shown therein, a high speed pulse laser in a generating module 1 of a to-be tested ultra-high speed time-wavelength interleaved optical pulse sequence employs an active mode-locked laser 1-1 with an output repetition frequency of 10 GHZ, a frequency spectrum 6 thereof passing a wavelength division multiplexer 1-2 and being splitted into 4 paths of frequency spectrum 7 of various wavelength. An output 8 of each path passes respectively via a variable optical delay line 1-4, and subsequently passes respectively via a variable attenuator 1-4; subsequently, a photonic sampler on each wavelength division and multiplexing path enters a wavelength division multiplexer 1-5, and all the photonic samplers combine into one path of optical pulse sequence 9 with a repetition frequency of 40 GHZ. The optical pulse sequence 9 is outputted, passes via a 1×2 optical fiber coupler 2, and is splitted equally into 2 paths, with one path being inputted to an optical spectrum analyzing module 3 for measurement, with spectrum data 3-2 of the 4 channels being obtained by means of the spectrometer 3-1; while the other path is inputted to an electrical spectrum analyzing module 4. In the electrical spectrum analyzing module, the optical pulse sequence 9 first passes via a photodetector 4-1 for conversion to a radio frequency signal, and is subsequently inputted to an electrical spectrum analyzer 4-2 for measurement to obtain a radio frequency power spectrum data 4-3. The data analyzing and processing module 5 employs numerical computation method to obtain the $\tilde{u}_k(f)$ and $a_k$ of the 4 channels in accordance with the expressions (4) and (5):

$$a_k = \left| \int_{-\infty}^{+\infty} E_k(f) df \right|^2 \tag{15}$$

$$\tilde{u}_k(f) = \frac{|E_k(f)|^2}{\max\{|E_k(f)|^2\}}$$

$$k = 1, 2, 3, 4$$

wherein $E_k(f)$, k=1, 2, 3, 4 being an optical spectrum as measured by the spectrometer for the kth channel.

The data analyzing and processing module 5, in accordance with the expression (9) and the peaks $C_k$, k=1, 2, 3, 4 of the radio frequency power spectrum data 4-3, obtains the following equations:

$$\begin{cases} 10 \log_{10}(P_4/P_1) = C_4 - C_1 \\ 10 \log_{10}(P_4/P_2) = C_4 - C_2 \\ 10 \log_{10}(P_4/P_3) = C_4 - C_3 \\ \tau_1 = 0 \end{cases} \tag{16}$$

Figure 3:
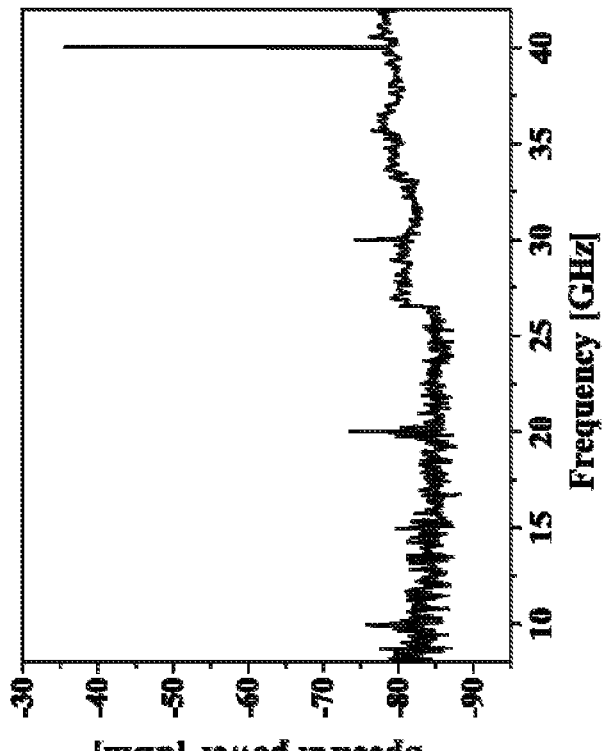
Figure 3:
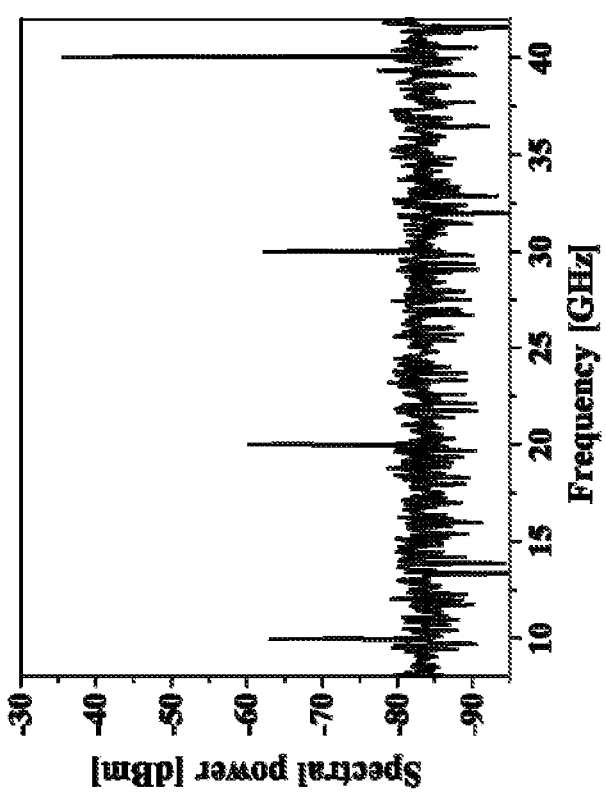

By substituting the expression (15) into the expression (16) for numerical solution, the amplitude $a_k$ and the time delay error $\tau_k$, k=1, 2, 3, 4, are obtained; that is, time delay and amplitude mismatch information 10 of each channel is obtained. The data analyzing and processing module 5 inputs the obtained time delay and amplitude mismatch information 10 into the driving and feedback module 11, and the driving and feedback module 11 outputs a corresponding adjustment signal in accordance with the comparative value of the time delay and amplitude of each channel to drive the adjustment of the variable time delay line 1-3 and the variable attenuator 1-4, by increasing a relatively small time delay and amplitude value, while decreasing a relatively big time delay and amplitude value, to arrive at balance of time delay and amplitude among all the channels, thus achieving compensation of channel mismatch. FIG. 3(a) shows numerical simulation result of the radio frequency power spectrum in accordance with the mismatch information, from which, as compared with the experiment result shown in FIG. 2(b), can be seen that the two correspond accurately, and that the mismatch measuring method provided by the present invention is accurate and dependable. FIG. 3(b) shows a post-compensation radio frequency power spectrum, and as can be seen therefrom, the clutters are substantially inhibited.

In the above process, optical spectrum and radio frequency spectrum of the time-wavelength interleaved optical pulse sequence of 40 GHz are measured for the 4 channels, channel mismatch information among the channels is obtained by means of numerical analysis, and the effectiveness of the method is validated by comparing the experiment result with that of the simulation based on mismatch information. Furthermore, on the basis of the mismatch information, mismatch may be compensated and corrected by means of further adjusting the variable optical delay line 1-3 and the variable attenuator 1-4. The present invention is based on frequency-domain measurement of the pulse, overcomes bottleneck of inadequate sampling in time-domain measurement, may acquire channel mismatch information from the frequency-domain measurement, and has characteristics of simplicity and ease of manipulation. The present invention is widely applicable in measurement, compensation and correction of channel mismatch in a generating system of an ultra-high speed time-wavelength interleaved pulse sequence.

We claim:

1. A method for measuring multi-channel mismatch of an ultra-high speed photonic sampler, comprising splitting a multi-channel optical pulse signal sequence to be tested into a first path of the signal sequence and a second path of the signal sequence by a 1×2 optical fiber coupler, inputting the first path of the signal sequence into a spectrometer to obtain a first measurement result, passing the second path of the signal sequence through a photodetector and inputting the second path of the signal sequence into an electrical spectrum analyzer to obtain a second measurement result, outputting the first measurement result from the spectrometer and the second measurement result from the electrical spectrum analyzer respectively to a data analyzing and processing module, calculating an amplitude $a_k$ as $a_k = |\int_{-\infty}^{+\infty} E_k(f)df|^2$, wherein k equals to 1, 2, ..., M, of each channel, M is a total number of all the channels, and $E_k(f)$ is an optical spectrum as measured by the spectrometer for the kth channel, calculating $\tilde{u}_k(f)$ as $$\tilde{u}_k(f) = \frac{|E_k(f)|^2}{\max\{|E_k(f)|^2\}}$$

as a Fourier transformation of $u_k(t)$, wherein the $u_k(t)$ is a normalized waveform of the kth channel, and calculating a time delay $\tau_k$ as $$\begin{cases} 10\log_{10}\dfrac{P_M(\tau_1, \tau_2, \ldots, \tau_M)}{P_k(\tau_1, \tau_2, \ldots, \tau_M)} = C_M - C_k, k = 1, 2, \ldots, M-1 \\ \tau_1 = 0 \end{cases}$$

wherein $C_k$, k=1, 2, ..., M are M spectrum peaks measured by the electrical spectrum analyzer, and $P_k$ are M peaks of a radio frequency spectrum on an interval $[0, f_s]$:

$$P_k = \left(\frac{R_{PD}}{MT_s}\right)^2 \left|\sum_{l=1}^{M} a_l \tilde{u}_l(kf_s/M) e^{-j2\pi(kf_s/M)\tau_l} e^{-j2\pi k(l-1)/M}\right|^2$$

$$k = 1, 2, \ldots, M$$

wherein $T_s$ is a sampling period, $f_s = 1/T_s$, and $R_{PD}$ is a responsivity of the photodetector.

2. A measurement compensation device for multi-channel mismatch of the ultra-high speed photonic sampler according to claim 1, comprising the 1×2 optical fiber coupler having an input port, the spectrometer having an input port and an output port, the photodetector, the electrical spectrum analyzer, the data analyzing and processing module having an input port and an output port, and a driving and feedback module having an input port and an output port;

wherein the input port of the 1×2 optical fiber coupler is connected to an output port of a generating module, and the generating module is for generating an ultra-high-speed time-and-wavelength-interleaved optical pulse sequence to be tested and has variable optical delay lines and variable attenuators;

the 1×2 optical fiber coupler splits the ultra-high-speed time-and-wavelength-interleaved optical pulse sequence into a first path and a second path, the first path is connected to the input port of the spectrometer, the second path is successively connected to the photodetector and the electrical spectrum analyzer, the output port of the spectrometer and the electrical spectrum analyzer are respectively connected to the input port of the data analyzing and processing module;

the output port of the data analyzing and processing module is connected to the input port of the driving and feedback module; and the output port of the driving and feedback module is connected to the variable optical delay lines and the variable attenuators of the generating module.

* * * * *